United States Patent [19]

Mings et al.

[11] 4,260,908
[45] Apr. 7, 1981

[54] MICROELECTRONIC REMOTE SWITCHING CIRCUIT

[75] Inventors: Joe D. Mings, McKinney; Manuel L. Torreno, Jr., Richardson, both of Tex.

[73] Assignee: Texas Instruments Incorporated, Dallas, Tex.

[21] Appl. No.: 938,151

[22] Filed: Aug. 30, 1978

[51] Int. Cl.³ .................. H03K 17/12; H03K 17/687; H03K 3/42; H03K 17/78
[52] U.S. Cl. .............................. 307/270; 250/211 J; 307/311; 307/584
[58] Field of Search ................ 307/200 B, 251, 270, 307/311, DIG. 1; 250/211 J, 273 A

[56] References Cited

U.S. PATENT DOCUMENTS

| 3,953,748 | 4/1976 | Sugiura et al. | 307/DIG. 1 X |
| 3,958,136 | 5/1976 | Schroeder | 307/270 X |
| 4,065,683 | 12/1977 | Clarke | 307/270 X |
| 4,068,135 | 1/1978 | Sonobe et al. | 307/251 X |
| 4,121,122 | 10/1978 | Porkrandt | 307/311 X |
| 4,142,684 | 3/1979 | Schweitzer | 307/270 X |
| 4,143,287 | 3/1979 | Biggs | 307/DIG. 1 X |

OTHER PUBLICATIONS

MacLeod, "A Sequential Gate Generator Designed in VMOS", *Electronic Engineering*, pp. 24, 8/1977.
Evans et al., "Higher Power Ratings Extend V-MOS FET'S Dominion", *Electronics*, pp. 105-112, 6/22/78.
Jenkins, "Interface Circuits Drive High-Level Switches from Low-Level Inputs", *Electronic Engineering*, pp. 45-49, 5/1971.

*Primary Examiner*—Larry N. Anagnos
*Attorney, Agent, or Firm*—Mel Sharp; Richard Donaldson; Gary Honeycutt

[57] ABSTRACT

A high power microelectronic switching circuit is interfaced with a fiberoptic data link, whereby inductive or resistive loads up to 20 amperes are switched, with a forward voltage drop of less than one volt. An input signal of one-half milliwatt is passed to the gate of a V-MOS FET power device, which drives a PNP output transistor to switch a power supply to a circuit load.

8 Claims, 3 Drawing Figures

MICROELECTRONIC REMOTE SWITCHING CIRCUIT

This invention relates to an optoelectronic control system for switching a power supply to a circuit load, and more particularly to a microelectronic semiconductor switch circuit capable of responding to a low power, optically generated input signal, and switching a 20 amp circuit load, with a forward voltage drop of less than one volt. The input signal is passed to the gate of an MOS power device which drives a bipolar output transistor.

For purposes of achieving remote switching, the automotive manufacturer has used mechanical relays. Until recently the power required to drive an electromechanical relay was not itself recognized as a problem. Moreover, the electromagnetic interference generated by mechanical relays was not particularly objectionable. However, today there is a clear incentive to reduce the power requirement to drive remote switching devices; and moreover, electromagnetic interference can be extremely troublesome because, for example, it may cause sensitive electronic controls to function erratically.

The power switch of the present invention permits a direct interface with a very low input power command signal, such as is typical of a low power microprocessor-fiberoptic output. The circuit is energized by an input signal of approximately one-half milliwatt, and is capable of controlling both inductive and resistive load applications up to a 20 ampere maximum, with a forward voltage drop no more than one volt. For example, the circuit can be used for switching power to load circuits such as a window lift motor, a seat liftmotor, a windshield wiper motor, headlights, and turn indicators. Also the switch is useful in non-automotive control applications.

One aspect of the invention is embodied in a microelectronic semiconductor switch circuit comprising a bipolar output transistor driven by an MOS power transistor. The MOS gate is adapted to receive an input command signal, while its source is adapted for grounding, and its drain is coupled to the base of the bipolar transistor. The bipolar device has its emitter adapted for connection to the power supply, and its collector adapted for connection to the load for which remote switching is desired.

Preferably, a zener diode is connected between the source and gate of the MOS transistor, for the purpose of protecting the MOS gate against any transient voltage spikes.

It is also preferred to include a rectifier connected across the emitter and collector of the bipolar transistor to protect it against a possible reverse polarity connection of the power supply.

Still further, it is preferred to include a resistor connected base-to-emitter across the bipolar device in order to reduce high temperature leakage current. A similar bleeder resistance may be connected across the gate and source of the MOS transistor to provide a discharge path for any external leakage current.

In accordance with a more comprehensive aspect, the invention is embodied in an optoelectronic control system for switching power to inductive or resistive circuit loads, including means for generating an optical input signal, means for converting the optical signal to an electronic signal, and electronic means responsive to said electronic signal for switching a high-voltage power supply to a circuit load. The switching means includes an MOS power transistor having its gate coupled to receive said electronic signal, its source grounded, and its drain coupled to the base of a PNP transistor whose emitter is coupled to said power supply, and whose collector is coupled to the circuit load.

Preferably, this embodiment further includes the zener diode, the rectifier, and the bleeder resistors noted above.

Figure 1:
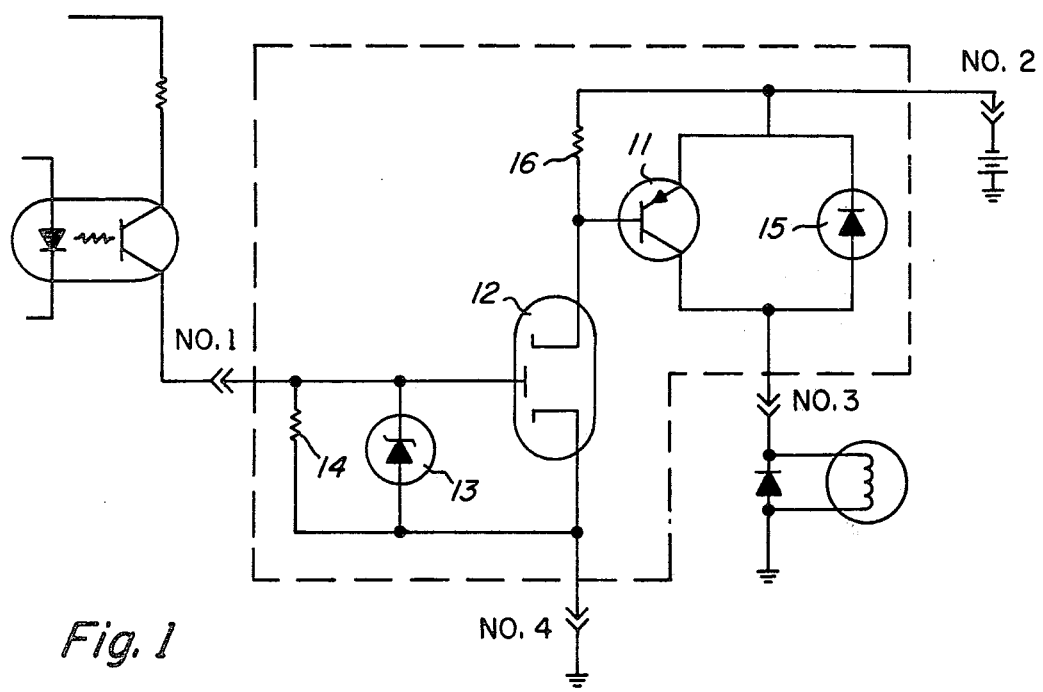
FIG. 1 is a circuit diagram showing the microelectronic semiconductor switch of the invention.

In FIG. 1 the switch circuit is seen to include a PNP transistor 11 driven by an MOS power transistor 12. For example, transistor 11 may be a Texas Instruments 2N5683 bipolar transistor; while transistor 12 may be a Texas Instruments 2N6657 VMOS Power FET.

Terminal number one of the circuit receives the input command signal and is connected to the MOS gate, placing transistor 12 in the "on" state. Transistor 11 is thereby also driven to the "on" condition, which switches a power supply provided at terminal No. 2, connecting it to a load circuit through terminal No. 3. Terminal No. 4 is grounded.

A zener diode 13 is connected between the source and gate of transistor 12 to protect the FET gate against transient voltage spikes. A bleeder resistor 14 is also connected across the gate to source of transistor 12, providing a discharge path for any external leakage current.

Resistor 14 has a value of 5,000 to 200,000Ω, preferably 25,000 to 100,000Ω. At temperatures below −10° C. the current path provided by this resistor becomes essential to prevent the switch circuit from latching in the "on" state.

A rectifier 15 is connected across emitter to collector of transistor 11 for protection against reverse polarity connection of the power supply at terminal No. 2.

A second bleeder transistor 16 is connected across the base emitter of transistor 11 to reduce the high temperature leakage current.

Figure 2:
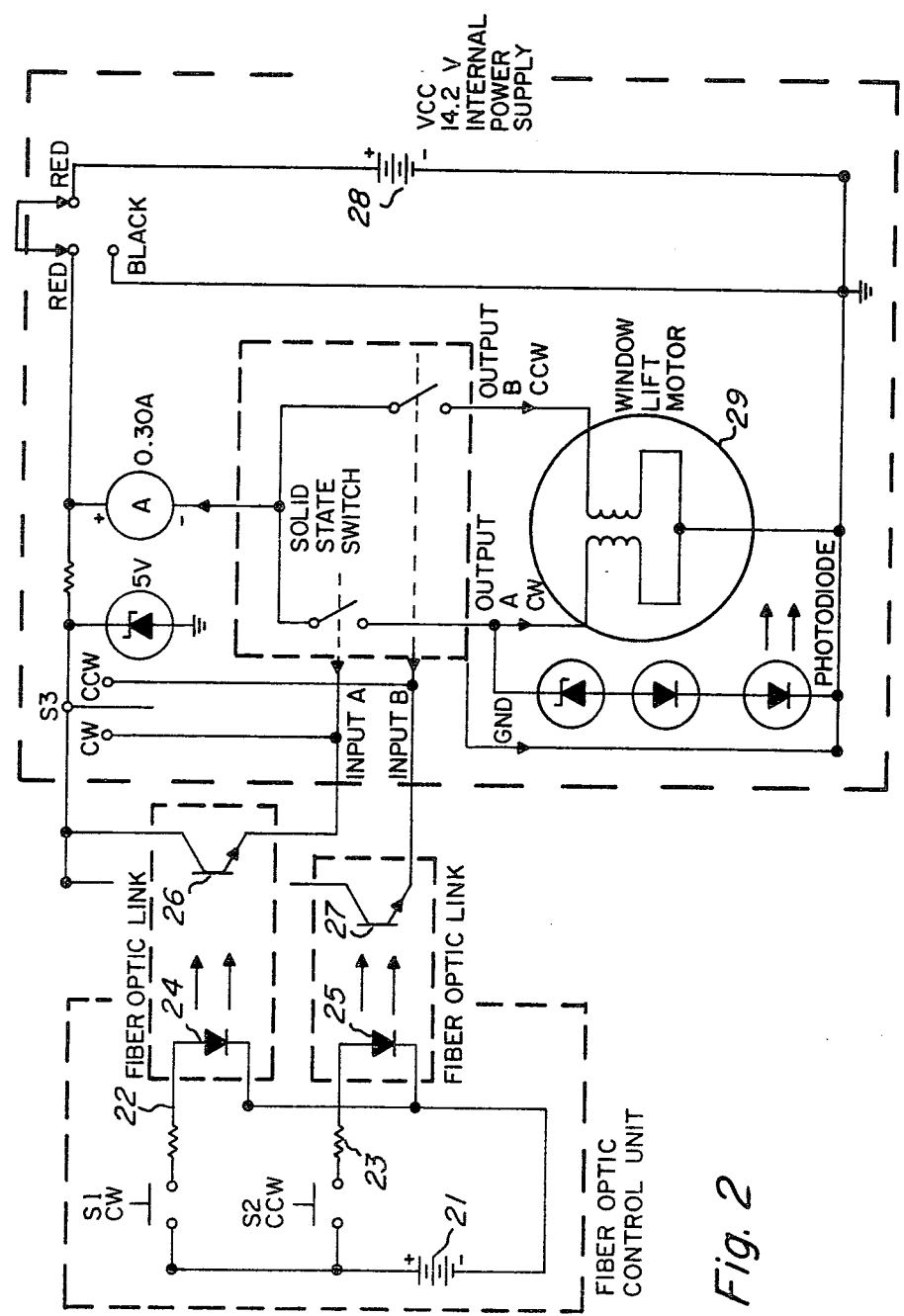
FIG. 2 is a schematic diagram showing the optoelectronic control system of the invention, including the fiberoptic link for generating the command signal, in combination with the switch circuit, the power supply, and the load circuit.

In FIG. 2 a dual input/output system is illustrated, whereby input A is for clockwise rotation of a window lift motor, and input B is for counterclockwise rotation, as required for lifting and then lowering the window.

The fiber optic control unit includes a power supply 21, clockwise switch $S_1$, counterclockwise switch $S_2$, and resistors 22 and 23.

The fiber optic link includes light-emitting diodes 24 and 25, coupled with phototransistors 26 and 27, respectively, by means of an optical fiber, such as DuPont Crofon, for example.

The signal generated by phototransistor 26 becomes input A for the clockwise half of the solid state switch; while the signal generated by transistor 27 is input B for the counterclockwise half. Power from battery 28 is switched alternatively to the clockwise or counterclockwise half of lift motor 29.

Figure 3:
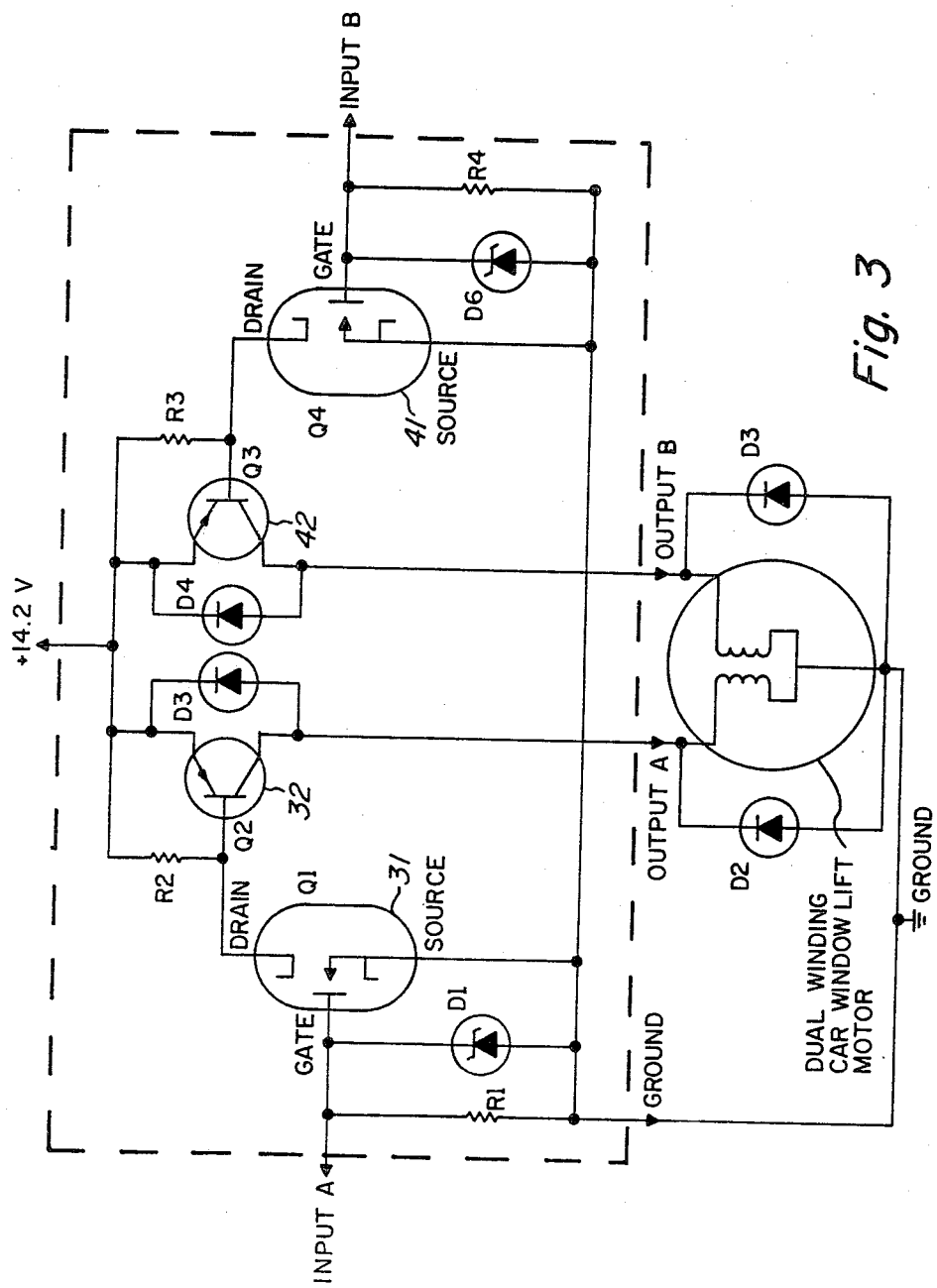
FIG. 3 is a circuit diagram of the dual solid state switch of FIG. 2.

In FIG. 3 the details are shown of the dual solid state switch of FIG. 2. That is, input A to the gate of V-MOS FET 31 turns the device "on," thereby driving transistor 32 to its conducting state, which switches power to output A for clockwise activation of the lift motor.

Input B to the gate of transistor 41 turns the device "on," thereby driving transistor 42 to its conducting state, which switches power to output B for counterclockwise activation of the lift motor.

The switch circuit of the invention has inherent temperature compensation. That is, the bipolar transistor has a negative temperature coefficient, while the FET has a positive temperature coefficient. These characteristics tend to counteract each other over a temperature range of −40° C. to 125° C. for example.

Although any power MOS FET is useful in the circuit, the V-MOS is preferred because of its low maximum forward voltage drop, and its low-power, high input impedance turn-on characteristics. For a complete description of V-MOS, see Arthur D. Evans et al, *Electronics,* June 22, 1978, pp. 105–112.

We claim:

1. An optoelectronic control system for switching power to an inductive or resistive circuit load, comprising means for generating an optical input signal, means for converting the optical signal to an electronic signal, and electronic means responsive to said electronic signal for switching a high-voltage power supply to said circuit load; said switching means including an MOS power transistor having its gate coupled to receive said electronic signal, its source grounded, and its drain coupled to the base of a PNP transistor whose emitter is coupled to said power supply, and whose collector is coupled to a circuit load requiring up to 20 amperes of current, said switching means having the capability to conduct such current.

2. A system as in claim 1 wherein said power transistor has VMOS geometry.

3. A system as in claim 2 further including a zener diode connected between the source and gate of said MOS transistor.

4. A system as in claim 3 further including a rectifier connected across the emitter and collector of said PNP transistor, to protect against reverse polarity connection of the power supply.

5. An optoelectronic control system for switching power to an inductive or resistive circuit load, comprising means for receiving an optical input signal, means for converting the optical signal to an electronic signal, and electronic means responsive to said electronic signal for switching a high-voltage power supply to said circuit load; said switching means including an MOS power transistor having its gate coupled to receive said electronics signal, its source grounded, and its drain coupled to the base of a PNP transistor whose emitter includes means for coupling to said power supply, and whose collector includes means for coupling to a circuit load requiring up to 20 amperes of current, said switching means having the capability to conduct such current.

6. A system as in claim 5 wherein said power transistor has VMOS geometry.

7. A system as in claim 6 further including a zener diode connected between the source and gate of said MOS transistor.

8. A system as in claim 7 further including a rectifier connected across the emitter and collector of said PNP transistor, to protect against reverse polarity connection of the power supply.

* * * * *